United States Patent
Reznicek et al.

(10) Patent No.: US 11,222,922 B2
(45) Date of Patent: Jan. 11, 2022

(54) RESISTIVE RANDOM ACCESS MEMORY CELLS INTEGRATED WITH SHARED-GATE VERTICAL FIELD EFFECT TRANSISTORS

(71) Applicant: International Business Machines Corporation, Armonk, NY (US)

(72) Inventors: Alexander Reznicek, Troy, NY (US); Bahman Hekmatshoartabari, White Plains, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 16/723,125

(22) Filed: Dec. 20, 2019

(65) Prior Publication Data

US 2021/0193737 A1   Jun. 24, 2021

(51) Int. Cl.
  *H01L 27/24*   (2006.01)
  *H01L 45/00*   (2006.01)

(52) U.S. Cl.
  CPC ...... *H01L 27/2454* (2013.01); *H01L 45/1253* (2013.01); *H01L 45/1683* (2013.01); *H01L 45/08* (2013.01); *H01L 45/1233* (2013.01); *H01L 45/146* (2013.01)

(58) Field of Classification Search
  CPC ............... H01L 27/2454; H01L 45/124; H01L 29/66666
  See application file for complete search history.

(56) References Cited

U.S. PATENT DOCUMENTS

| | | |
|---|---|---|
| 8,890,108 B2 | 11/2014 | Satoh |
| 9,029,822 B2 | 5/2015 | Satoh |
| 9,443,590 B2 | 9/2016 | Petti |
| 9,525,064 B1 | 12/2016 | Balakrishnan |
| 9,595,568 B2 | 3/2017 | Mine |
| 9,761,712 B1 | 9/2017 | Anderson |
| 9,806,173 B2 | 10/2017 | Balakrishnan |
| 10,008,596 B2 | 6/2018 | Balakrishnan |

(Continued)

OTHER PUBLICATIONS

Jian, et al., "Variation-tolerant CuxSiyO-based RRAM for low power application", IEICE Electronics Express, vol. 9, vol. 21, (2012), pp. 1654-1659.

(Continued)

*Primary Examiner* — Mark V Prenty
(74) *Attorney, Agent, or Firm* — Michael A. Petrocelli

(57) ABSTRACT

A two-transistor-two-resistor (2T2R) resistive random access memory (ReRAM) structure, and a method for forming the same includes two vertical field effect transistors (VFETs) formed on a substrate, each VFET includes an epitaxial region located above a channel region and below a dielectric cap. The epitaxial region includes two opposing protruding regions of triangular shape that extend horizontally beyond the channel region. A metal gate material is disposed on and around the channel region. A portion of the metal gate material is located between the two VFETs. A ReRAM stack is deposited within two openings adjacent to a side of each VFET that is opposing the portion of the metal gate material located between the two VFETs. A portion of the epitaxial region in direct contact with the ReRAM stack acts as a bottom electrode for the ReRAM structure.

6 Claims, 15 Drawing Sheets

(56) References Cited

U.S. PATENT DOCUMENTS

| | | |
|---|---|---|
| 10,079,267 B1 | 9/2018 | Yeh |
| 10,186,510 B2 | 1/2019 | Schultz |
| 10,269,869 B1 * | 4/2019 | Ando ................ H01L 29/66439 |
| 10,283,565 B1 | 5/2019 | Xu |
| 10,297,290 B1 | 5/2019 | Beigel |
| 10,879,311 B2 * | 12/2020 | Lee .................... H01L 45/1608 |
| 2016/0260775 A1 | 9/2016 | Takaki |
| 2019/0198571 A1 | 6/2019 | Xu |
| 2021/0167129 A1 * | 6/2021 | Reznicek ............ H01L 45/1683 |

OTHER PUBLICATIONS

Pan, et al., "1Kbit FINFET Dielectric (FIND) RRAM in Pure 16nm FinFET CMOS Logic Process", 2015 IEEE International Electron Devices Meeting (IEDM), pp. 10.5.1-10.5.4.

International Search Report and Written Opinion, International Application No. PCT/IB2020/061517, International Filing Date Dec. 4, 2020, 10 pages.

Reznicek, et al., "Resistive Random Access Memory Cells Integrated With Shared-Gate Vertical Field Effect Transistors", PCT International Application No. PCT/IB2020/061517, International Filing Date Dec. 4, 2020. 23 pages.

* cited by examiner

RESISTIVE RANDOM ACCESS MEMORY CELLS INTEGRATED WITH SHARED-GATE VERTICAL FIELD EFFECT TRANSISTORS

BACKGROUND

The present invention generally relates to the field of magnetic storage devices, and more particularly to integrating resistive random access memory (ReRAM) devices with vertical field effect transistors (VFETs) having a shared gate.

ReRAM is one of the most promising technologies for non-volatile memory devices. Thanks to the low power and high speed operation, the high density CMOS-compatible integration, and the high cycling endurance, ReRAM technology is becoming the mainstream option for high-density storage arrays and novel in-memory computing systems.

The essential ReRAM mechanism is based on the formation and rupture of a nanoscale conducting filament typically formed between two electrodes that results in repeatable resistive switching between a high-resistance state and low-resistance state. A drawback of the ReRAM mechanism is that it relies on randomness, and the position of the conducting filament is not under control. Therefore, improved designs and techniques for formation of ReRAM devices would be desirable.

SUMMARY

Shortcomings of the prior art are overcome and additional advantages are provided through the provision of a method for forming a semiconductor device that includes forming two vertical field effect transistors on a substrate, each of the vertical field effect transistors includes an epitaxial region located above a channel region and below a dielectric cap. The epitaxial region includes two opposing protruding regions of triangular shape that extend horizontally beyond the channel region. A metal gate material is disposed on and around the channel region, with a portion of the metal gate material located between the two vertical field effect transistors. An interlevel dielectric layer above the metal gate material is recessed to form two openings, each opening is adjacent to a side of each vertical field effect transistor that is opposing the portion of the metal gate material located between the two vertical field effect transistors. Each opening exposes a portion of the epitaxial region of each vertical field effect transistor. A resistive random access memory stack is deposited within each opening, the resistive random access memory stack includes an oxide layer located directly above the exposed portion of the epitaxial region, a top electrode layer directly above the oxide layer and a metal fill above the top electrode layer. The exposed portion of the epitaxial region acts as a bottom electrode for the resistive random access memory stack.

Another embodiment of the present disclosure provides a method for forming a semiconductor device that includes forming a doped source on a substrate, forming a dummy gate on the doped source, the dummy gate arranged between a first spacer disposed on the doped source and a second spacer disposed on the dummy gate. Two trenches are formed in the dummy gate, the first spacer, and the second spacer to expose the doped source and grow an epitaxial layer within each trench off the doped source to form two fins. Each fin includes a channel region that extends from the doped source and through the dummy gate. A top portion of each of the fins is recessed to form a dielectric cap. An epitaxial region is grown on a portion of the fins to form a source/drain region over the dummy gate and below the dielectric cap, the epitaxial region includes two opposing protruding regions of triangular shape that extend horizontally beyond the fins. The dummy gate is replaced with a gate stack including a metal gate material that surrounds the channel region, a portion of the gate stack is located between the two fins. The metal gate material is etched to expose the epitaxial region. An interlevel dielectric layer is formed to separate the epitaxial region from the metal gate material. The interlevel dielectric layer is then recessed to form two openings, each opening exposes a portion of the epitaxial region opposing the portion of the gate stack located between the two fins. An oxide layer is conformally deposited within each opening, and a top electrode layer is formed directly above the oxide layer.

Another embodiment of the present disclosure provides a semiconductor device that includes two vertical field effect transistors, each vertical field effect transistor including an epitaxial region located above a channel region and below a dielectric cap. The epitaxial region includes two opposing protruding regions of triangular shape that extend horizontally beyond the channel region. A metal gate material disposed on and around the channel region, with a portion of the metal gate material located between the two vertical field effect transistors. An interlevel dielectric layer is located above the metal gate material, and two resistive random access memory structures. Each resistive random access memory is adjacent to a side of a vertical field effect transistor of the two vertical field effect transistors that is opposing the portion of the metal gate material located between the two vertical field effect transistors. Each of the resistive random access memory structures includes an oxide layer located directly above the epitaxial region, a top electrode layer directly above the oxide layer and a metal fill above the top electrode layer. The epitaxial region acts as a bottom electrode for the resistive random access memory structure.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
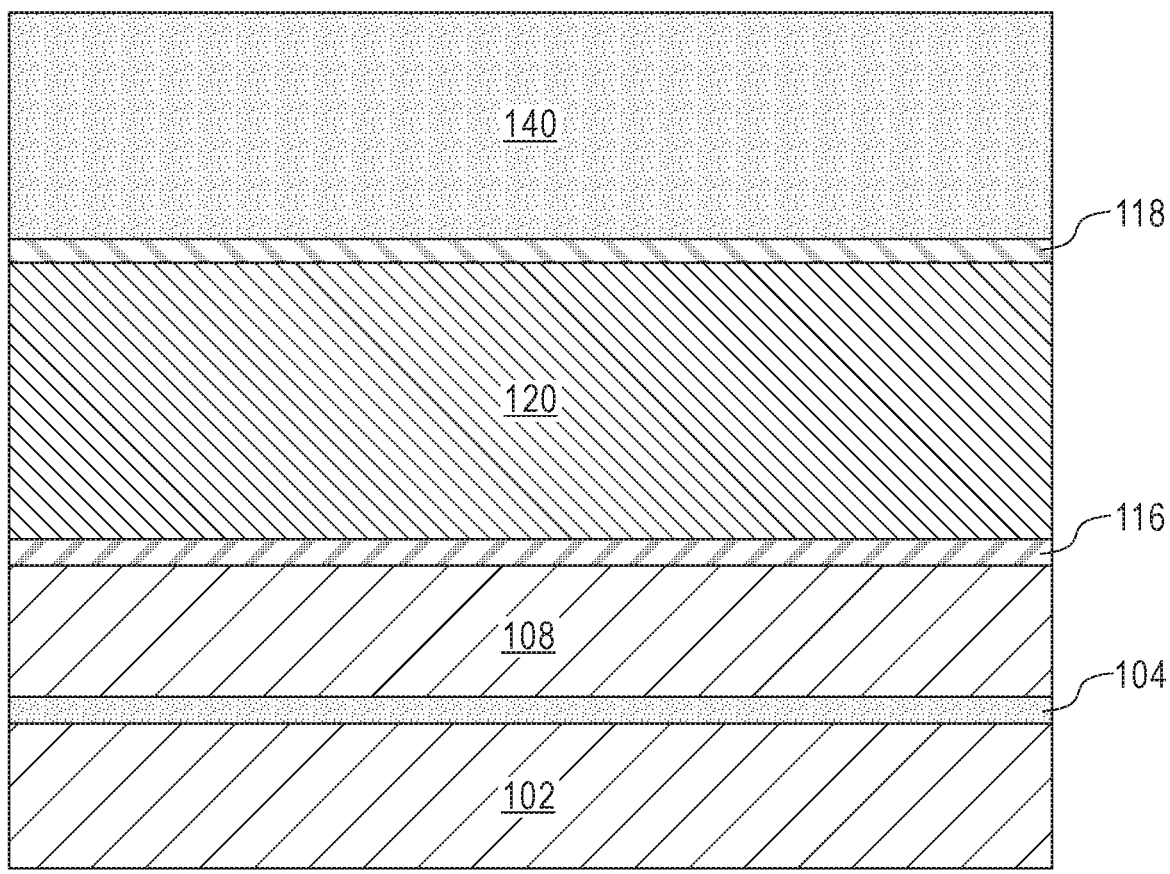
FIG. 1 is a cross-sectional view of a semiconductor device at an intermediate step during a method of making two vertical field effect transistors, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

ReRAM structures typically include a top electrode, a bottom electrode, and an oxide layer positioned between the two electrodes. In oxide ReRAMs, electroforming of current conducting filament is needed. This process relies on randomness which hinders controlling the position of the current conducting filament of the oxide ReRAM. This results in a higher forming voltage as the ReRAM cell is scaled and higher device variability.

Additionally, due to the randomness in the electroforming process, the post forming resistance states (i.e., low resistance state (LRS) and high resistance state (HRS)) show wide distributions that narrows the memory window. Oxide ReRAM typically requires a current control field effect transistor (FET) to form a one-transistor one-resistor (1T1R) structure. This process typically comes with a penalty in device area.

Therefore, embodiments of the present invention provide a method and associated structure for fabricating a two-transistor-two-resistor (2T2R) ReRAM structure in which the two field effect transistors share a metal gate. The proposed embodiments may reduce randomness of electroforming of the current conducting filament while making the device less susceptible to variability of ReRAM states and improving device scalability. Specifically, the proposed embodiments provide a vertically-stacked 2T2R non-volatile memory cell for field-programmable gate arrays (FPGAs) in which two oxide ReRAMs are co-integrated with two vertical field effect transistors sharing a metal gate using portions of the top source/drain regions of the VFETs as bottom electrode for the ReRAM structures.

One way to form the two-transistor-two-resistor ReRAM structure includes forming two VFET devices with a shared metal gate, each VFET device including a (faceted) epitaxial region with protruding outer portions, forming a ReRAM stack directly above the epitaxial regions of the VFET devices, the ReRAM stack includes an oxide layer above an electrode layer and a metal fill above the electrode layer, the oxide layer is in direct contact with the protruding outer portions of the (faceted) epitaxial regions that act as the bottom electrode for each of the ReRAM elements. An embodiment by which the two-transistor-two-resistor ReRAM structure can be formed is described in detailed below by referring to the accompanying drawings in FIGS. 1-15.

Referring now to FIG. 1, a cross-sectional view of a semiconductor device 100 at an intermediate step during a method of making a vertical field effect transistor (VFET) is shown, according to an embodiment of the present disclosure.

At this point of the manufacturing process, the semiconductor device 100 includes a dummy gate 120 and a dielectric capping layer 140 arranged on a semiconductor substrate 102 (hereinafter "substrate"). The substrate 102 includes, for example, a bulk semiconductor substrate. The substrate 102 includes one or more semiconductor materials. Non-limiting examples of suitable semiconductor materials for the substrate 102 may include silicon (Si), strained Si, silicon carbide (SiC), germanium (Ge), silicon germanium (SiGe), silicon-germanium-carbon (SiGeC), Si alloys, Ge alloys, III-V materials (e.g., gallium arsenide (GaAs), indium arsenide (InAs), indium phosphide (InP), or aluminum arsenide (AlAs)), II-VI materials (e.g., cadmium selenide (CdSe), cadmium sulfide (CdS), cadmium telluride (CdTe), zinc oxide (ZnO), zinc selenide (ZnSe), zinc sulfide (ZnS), or zinc telluride (ZnTe)), or any combination thereof. In an embodiment, the substrate 102 may include germanium.

A doped source 108 is arranged on the substrate 102 over a counter-doped layer 104. The doped source 108 and the counter-doped layer 104 are formed on the substrate 102 by incorporating dopants into the substrate 102 or via epitaxial growth. According to an embodiment, the doped source 108 is heavily doped with a dopant, which may be a p-type dopant (e.g., boron or gallium) or an n-type dopant (e.g., phosphorus or arsenic). The counter-doped layer 104 includes a dopant that is different/opposite than the dopant in the doped source 108. For example, when the doped source 108 includes a p-type dopant, the counter-doped layer 104 includes an n-type dopant, and when the doped source 108 includes an n-type dopant, the counter-doped layer 104 includes a p-type dopant. The doped source 108 is heavily doped, including a dopant concentration varying between approximately $10^{19}$ atoms/cm$^3$ to approximately $10^{22}$ atoms/cm$^3$. A thickness of the counter-doped layer may be in a range varying from approximately 5 to approximately 50 nm, or from approximately 10 to approximately 20 nm. A thickness of the doped source 108 may be in a range varying from approximately 50 to approximately 250 nm, or from approximately 100 to approximately 200 nm.

The dummy gate 120 is disposed on the doped source 108 between a first spacer 116 and a second spacer 118. The first spacer 116 is deposited on the doped source 108, the dummy gate 120 is deposited on the first spacer 116, and the second spacer 118 is deposited on the dummy gate 120. The first spacer 116 and the second spacer 118 may include an insulating material, for example, silicon dioxide, silicon nitride, SiOCN, or SiBCN. Other non-limiting examples of materials for the first spacer 116 and the second spacer 118 include dielectric oxides (e.g., silicon oxide), dielectric nitrides (e.g., silicon nitride), dielectric oxynitrides, or any combination thereof. Materials forming the first spacer 116 and the second spacer 118 are deposited by a standard deposition processes including, for example, chemical vapor deposition (CVD) or physical vapor deposition (PVD). The first spacer 116 and the second spacer 118 may each have a thickness varying between approximately 3 nm to approximately 15 nm, or between approximately 5 nm to approximately 10 nm.

The dummy gate 120 includes a sacrificial gate material, for example, amorphous silicon (aSi) or polycrystalline silicon (polysilicon). The sacrificial gate material may be deposited by a deposition process, including, but not limited to, PVD, CVD, plasma enhanced chemical vapor deposition (PECVD), inductively coupled plasma chemical vapor deposition (ICP CVD), or any combination thereof. The sacrificial gate material forming the dummy gate 120 has a thickness varying between approximately 8 nm to approximately 100 nm, or between approximately 10 nm to approximately 30 nm.

The dielectric capping layer 140 is deposited on the second spacer 118 over the dummy gate 120. Non-limiting examples of materials for the dielectric capping layer 140 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 140 has a thickness in a range varying from approximately 30 nm to approximately 200 nm, or from approximately 50 nm to approximately 100 nm.

Figure 2:
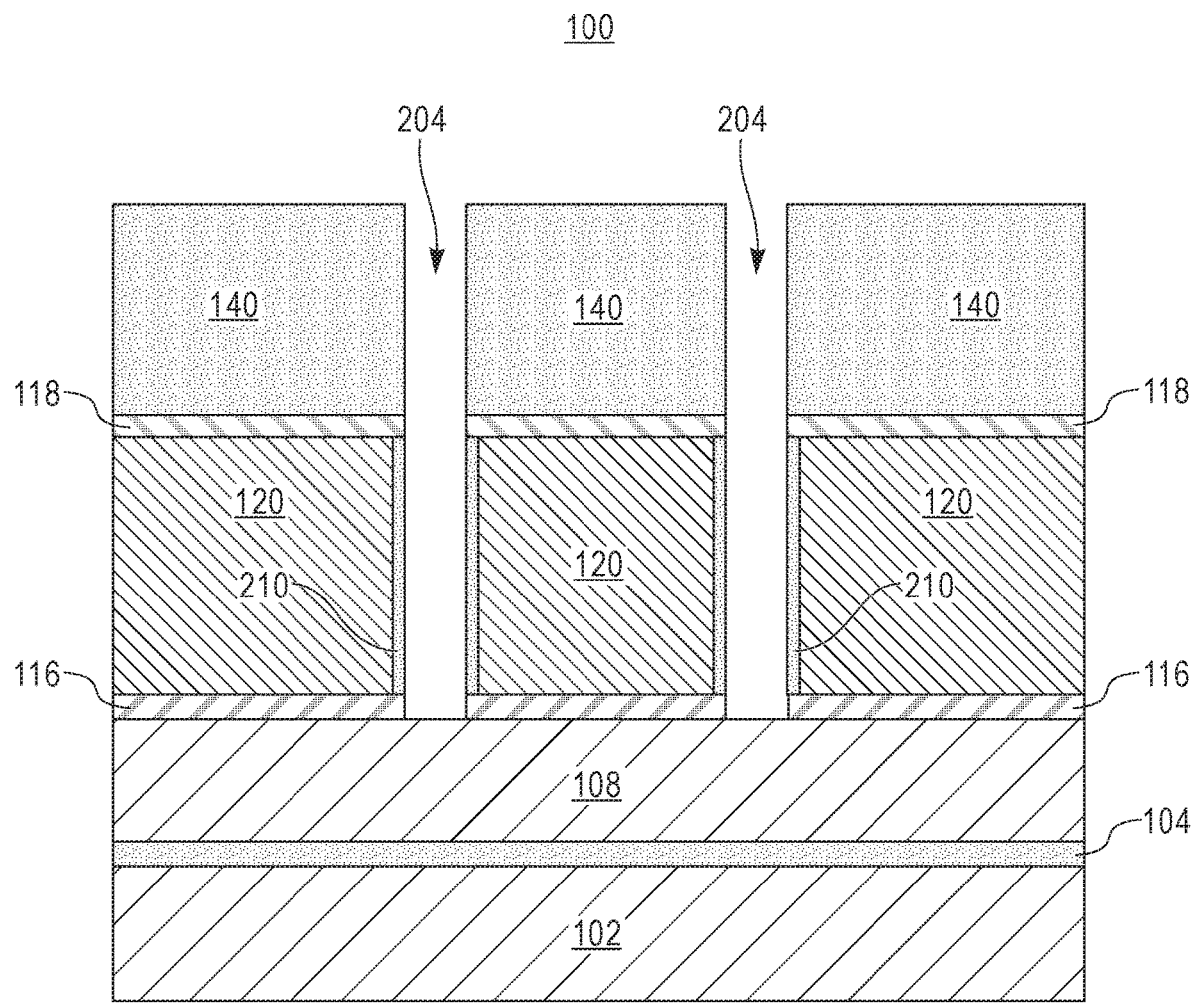
FIG. 2 is a cross-sectional view of the semiconductor device illustrating forming trenches through a dielectric capping layer, a second spacer, a dummy gate, and first spacer to expose a doped source, according to an embodiment of the present disclosure.

Referring now to FIG. 2, a cross-sectional view of the semiconductor device 100 illustrating forming trenches 204 through the dielectric capping layer 140, second spacer 118, and the dummy gate 120 to expose the first spacer 116 is shown, according to an embodiment of the present disclosure.

The trenches 204 extend from a top surface of the dielectric capping layer 140 to a top surface of the first spacer 116, exposing the first spacer 116. The trenches 204 are formed by performing an etch process that is selective to (will not substantially remove) the material forming the first spacer 116. The etch process may be, for example, a reactive ion etch (RIE). As known by those skilled in the art, multiple etching processes can be performed to form the trenches 204. For example, a first etching process is performed to remove a portion of the dielectric capping layer 140 selective to the material of the second spacer 118. A second etching process is then performed to remove a portion of the second spacer 118, which underlies the portion of the trenches 204 formed from the first etching process, selective to the material of the dummy gate 120. A third etching process is then performed to remove a portion of the dummy gate 120, which underlies the portion of the trenches 204 formed from the second etching process, selective to the material of the first spacer 116. As shown in the figure, the resulting trenches 204 extend through a top surface of the dielectric capping layer 140 down to a top surface of an exposed portion of the first spacer 116. The width of the trenches 204 may vary from approximately 3 nm to approximately 20 nm, or from approximately 5 nm to approximately 10 nm. The depth of the trenches 204 may vary from approximately 50 nm to approximately 300 nm, or from approximately 100 nm to approximately 200 nm.

With continued reference to FIG. 2, after forming the trenches 204, the first spacer 116 may also be etched using a process that is selective to (will not substantially remove) the doped source 108 material. The first spacer 116 may be etched by, for example, a reactive ion etch. The exposed portion of the first spacer 116 is removed by an etching process to expose a portion of the underlying source contact layer (i.e., doped source 108). This creates a self-aligned junction (not shown) because a source extension can be epitaxially grown from the doped source 108 to a top surface of the first spacer 116, as will be described in detail below.

An oxidation process may then be performed on the semiconductor device 100 to oxide inner portions of the dummy gate 120 sidewalls and form a thin oxide layer 210. The oxidation may be performed by a plasma oxidation process or other oxidation process that forms the thin oxide layer 210. In some embodiments, a portion of the first spacer 116 or the doped source 108 may also be oxidized. In such embodiments, any oxide formed in these regions is removed before performing the epitaxial growth described below in FIG. 3.

It should be noted that the steps above allows for a substantial reduction in the pitch between subsequently formed fins which may be advantageous for scaling purposes. As known by those skilled in the art, a fin will be subsequently growth within each trench 204.

Figure 3:
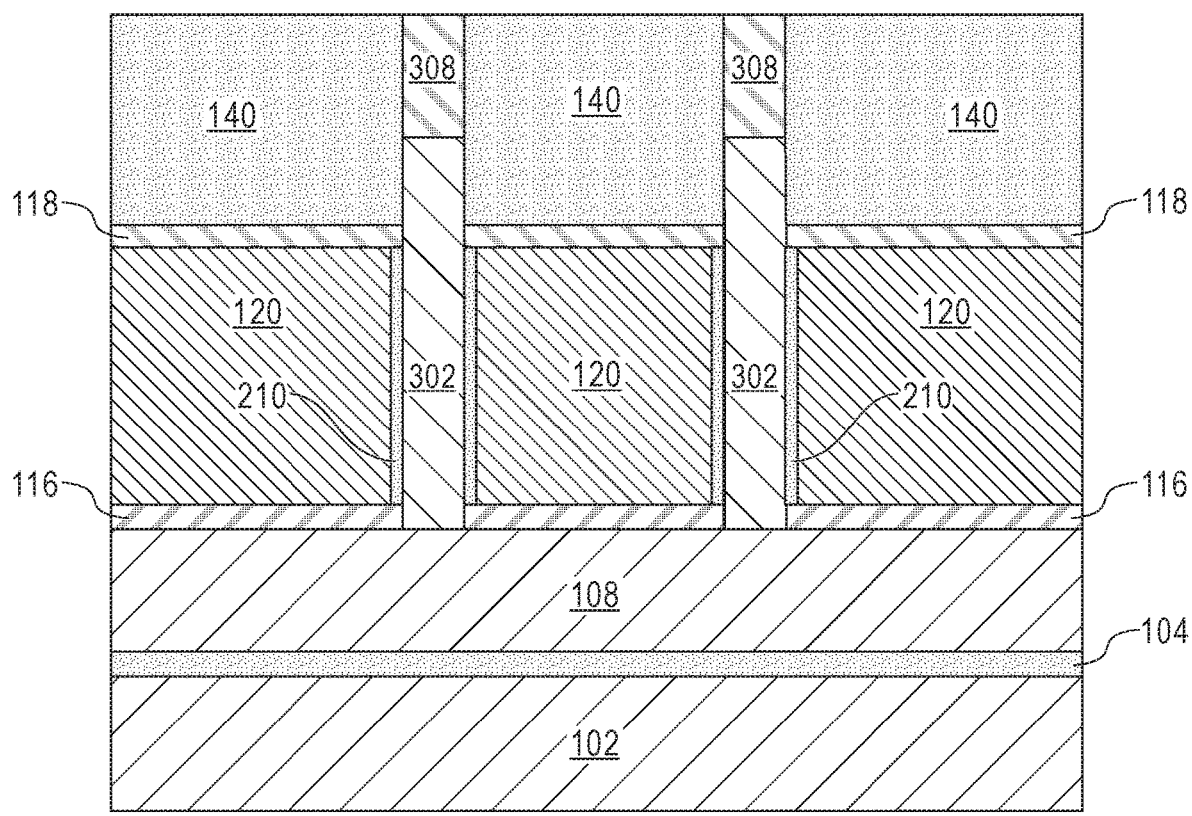
FIG. 3 is a cross-sectional view of the semiconductor device after growing an epitaxial layer off the doped source to form an epitaxial channel region in each of the trenches, according to an embodiment of the present disclosure.

Referring now to FIG. 3, a cross-sectional view of the semiconductor device 100 after growing an epitaxial layer off the doped source 108 to form an epitaxial channel region 302 (hereinafter "channel region") in each of the trenches 204 (FIG. 2) is shown, according to an embodiment of the present disclosure. As known by those skilled in the art, epitaxial growth of the channel region 302 includes an epitaxial semiconductor material, and the epitaxial growth and/or deposition processes are selective to forming on a semiconductor surface, and do not deposit material on other surfaces, such as the thin oxide layer 210, first spacer 116 or second spacer 118. The epitaxial growth of the channel region 302 may extend over the dielectric capping layer 140 (not shown).

The channel region 302 may be grown using a suitable epitaxial growth process including, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Sources for the epitaxial channel material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

A planarization process is conducted on the semiconductor device 100 to remove excess epitaxial growth (not shown) over the dielectric capping layer 140. The planarization process may be a chemical mechanical planarization (CMP) process. As known by those skilled in the art, each channel region 302 constitutes the channel region of subsequently formed vertical field effect transistors.

Subsequently, the channel region 302 may be partially recessed and filled with a dielectric material to form a dielectric cap 308. Specifically, the channel region 302 is partially recessed to a level that is still within the dielectric capping layer 140 and over the second spacer 116. The channel region 302 is recessed by using, for example, a reactive ion etch or a wet etch process.

The recess (not shown) formed over the channel region 302 is filled with the dielectric material to form the dielectric cap 308 above the channel region 302. The dielectric material forming the dielectric cap 308 may be a dielectric oxide (e.g., silicon oxide), a dielectric nitride (e.g., silicon nitride), a dielectric oxynitride, or any combination thereof. The dielectric material forming the dielectric cap 308 is deposited by standard deposition processes such as, for example, CVD or PVD. After deposition, excess dielectric material is planarized, by for example, CMP.

Figure 4:
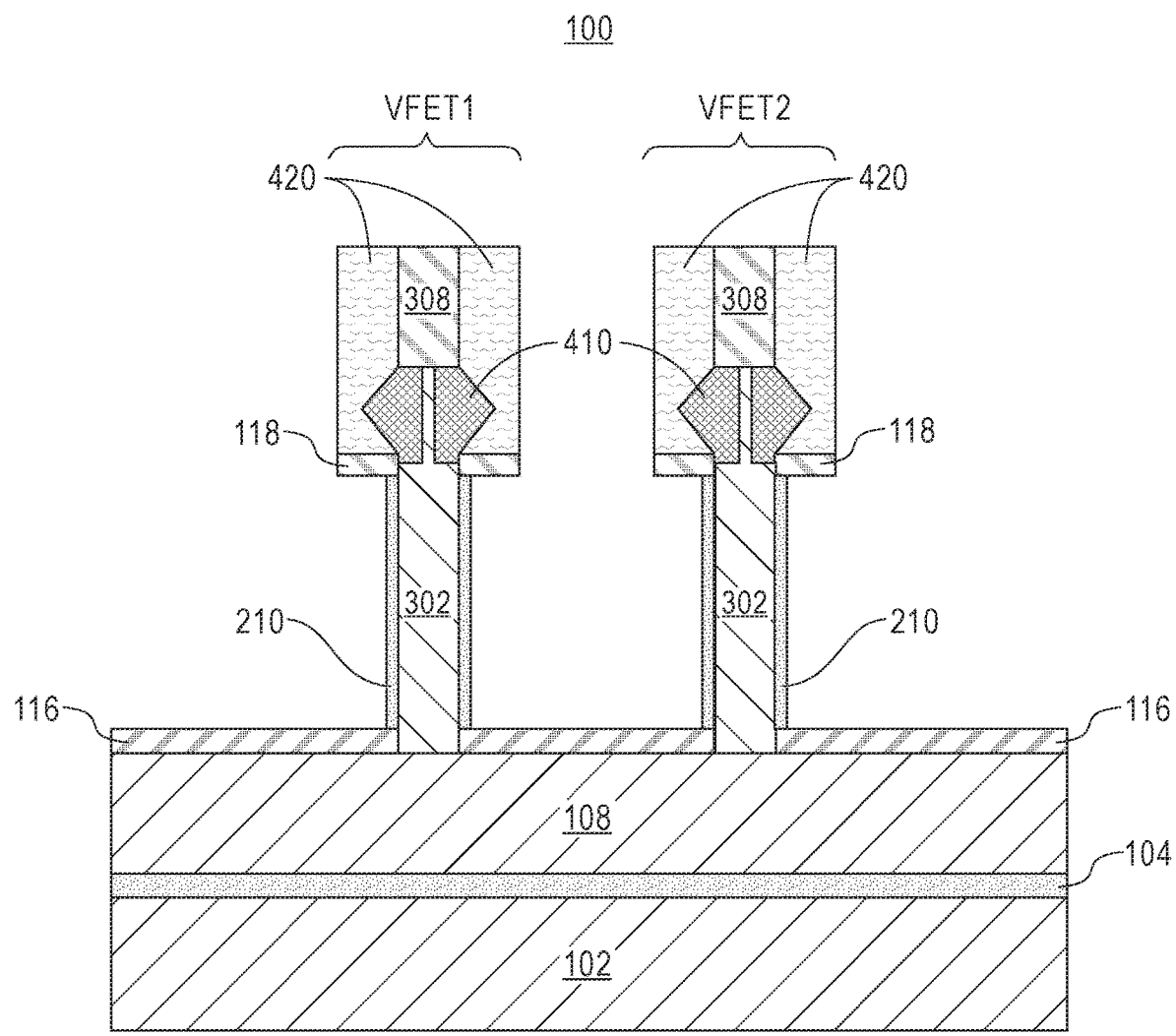
FIG. 4 is a cross-sectional view of the semiconductor device after removing a dielectric capping layer and forming an epitaxial region on the channel region, according to an embodiment of the present disclosure.

Referring now to FIG. 4, a cross-sectional view of the semiconductor device 100 after removing the dielectric capping layer 140 and forming an epitaxial region 410 on the channel region 302 to form a source/drain region for a first vertical field effect transistor (VFET1) and a second vertical field effect transistor (VFET2) is shown, according to an embodiment of the present disclosure.

For both of the VFET1 and VFET2, the epitaxial region 410 is arranged between the dielectric cap 308 and the channel region 302. As known by those skilled in the art, a portion of the channel region 302 over the second spacer 118 may be recessed along sidewalls before forming the epitaxial region 410. The epitaxial region 410 forms the source/drain region of the VFET1 and the source/drain region of the VFET2. Epitaxial growth of the epitaxial region 410 may be performed as described above in FIG. 3.

It should be noted that the diamond-shaped faceting effect observed in the epitaxial region 410 is the result of differential semiconductor growth along different crystallographic planes. The faceted epitaxial growth eventually slow down to very low growth rates and "terminates" at the set of crystal planes with the slowest growth rate (i.e. <111> planes), and therefore the resulting semiconductor structures have surfaces oriented in such crystal planes with the slowest semiconductor growth rate. The epitaxial region 410, as depicted in the figure, include two (opposing) protruding regions or portions of triangular shape (bound by <111> planes) that extend horizontally beyond the channel region 502 in each of the VFET1 and VFET2. As will be described below, this geometry may enhance hole/electron mobility towards the protruding or tip regions which may be advantageous for ReRAM performance. Various processing parameters, including the growth temperature, the growth pressure, the flow rates of the processing gases, etc., can be readily adjusted to modulate the relative growth rates along different sets of crystal planes and thereby control the surface orientations of the resulting semiconductor structures.

With continued reference to FIG. 4, a spacer 420 is deposited on opposing sides of each epitaxial region 410 to protect the epitaxial region(s) 410 during subsequent processing steps. The spacer 420 is also disposed on a sidewall of the dielectric cap 308. The spacer 420 includes an insulating material, for example, dielectric oxides (e.g., silicon oxide), dielectric nitrides (e.g., silicon nitride), dielectric oxynitrides, or any combination thereof. The spacer 420 material is deposited by standard deposition processes such as, for example, CVD or PVD. The spacer material may be etched by a dry etch process, for example, a RIE process, such that it covers the epitaxial region(s) 410 and is removed from a surface of the dielectric cap 308 and the second spacer 118. The spacer 420 has a width varying from approximately 5 nm to approximately 50 nm, or from approximately 15 nm to approximately 30 nm.

After forming the spacer 420, portions of the second spacer 118 and the dummy gate 120 are recessed to removed portions that extend horizontally beyond the spacer 420. An etch process that is selective to (will not substantially remove) the first spacer 116 is performed. The etch process may be a dry etch process, such as an RIE process.

Remaining portions of the dummy gate 120 may be removed by a wet etch process such as, for example, a process that includes hot ammonia.

Figure 5:
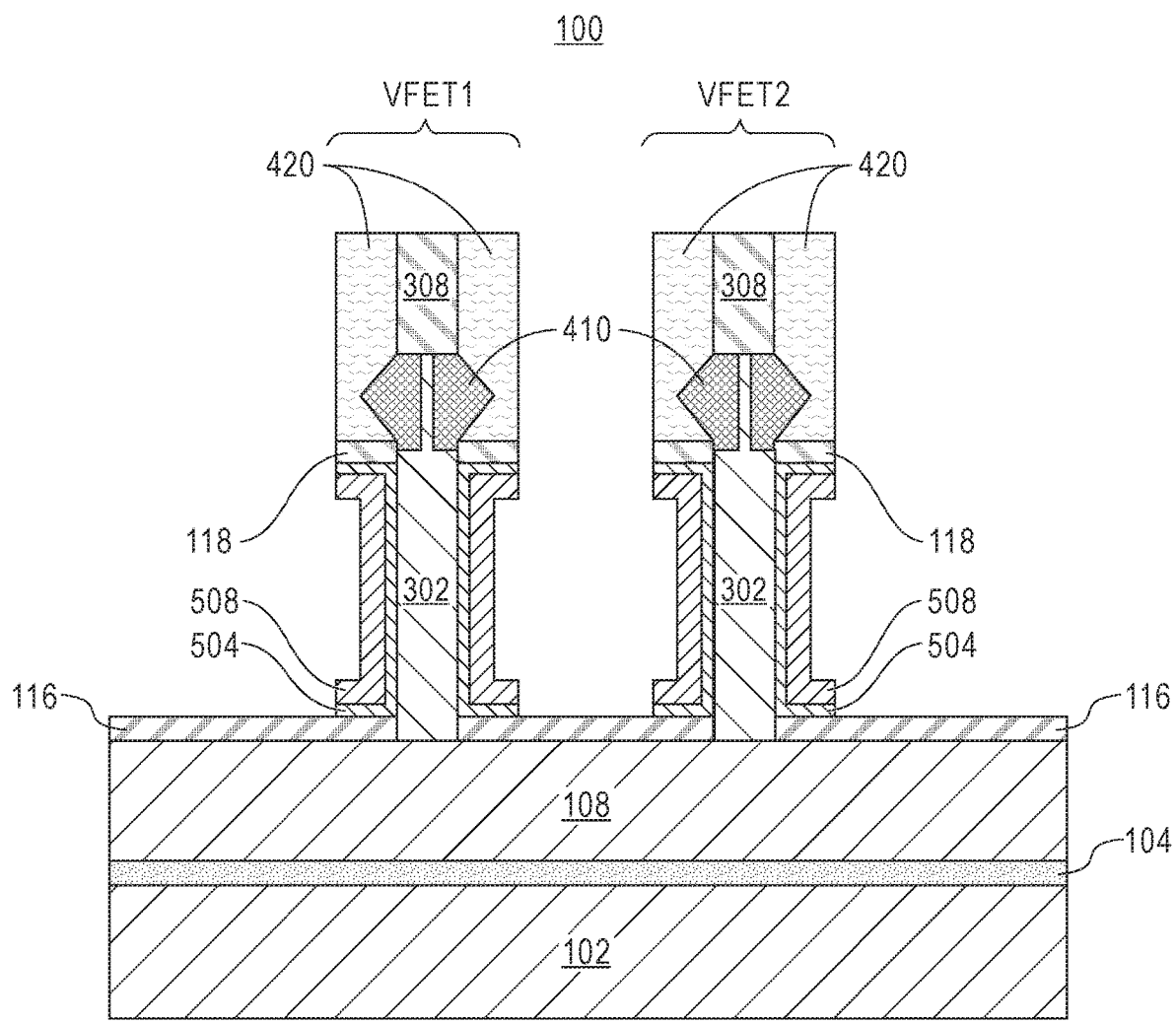
FIG. 5 is a cross-sectional view of the semiconductor device after removing a thin oxide layer and conformally depositing a gate dielectric material and a work function metal, according to an embodiment of the present disclosure.

Referring now to FIG. 5, a cross-sectional view of the semiconductor device 100 after removing the thin oxide layer 210 and conformally depositing a gate dielectric material 504 and a work function metal 508 is shown, according to an embodiment of the present disclosure. As known by those skilled in the art, the gate dielectric material 504 and the work function metal 508 form a portion of the gate stack that replaces the dummy gate 120 in each of the VFET1 and VFET 2. The gate dielectric material 504 and the work function metal 508 are disposed on the first spacer 116, the channel region 302, and remaining portions of the second spacer 118 beneath the epitaxial region 410.

The gate dielectric material(s) 504 can be a dielectric material having a dielectric constant greater than 3.9, 7.0, or 10.0. Non-limiting examples of suitable materials for the gate dielectric material 504 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 504 may be formed by suitable deposition processes including, for example, CVD, PVD, PECVD, ALD, evaporation, chemical solution deposition, or other like processes. The thickness of the gate dielectric material 504 may vary depending on the deposition process as well as the composition and number of high-k dielectric materials used.

The work function metal(s) 508 may be disposed over the gate dielectric material 504. The type of work function metal(s) 508 depends on the type of transistor. Non-limiting examples of suitable work function metals 508 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 508 may be deposited by a suitable deposition process, for example, CVD, PECVD, PVD, plating, thermal or e-beam evaporation, and sputtering.

The gate dielectric material 504 and the work function metal 508 are then recessed to removed portions that extend horizontally beyond the spacer 420, as illustrated in the figure. An etch process that is selective to (will not substantially remove) the first spacer 116 is performed. The etch process may be, for example, an anisotropic etch process.

Figure 6:
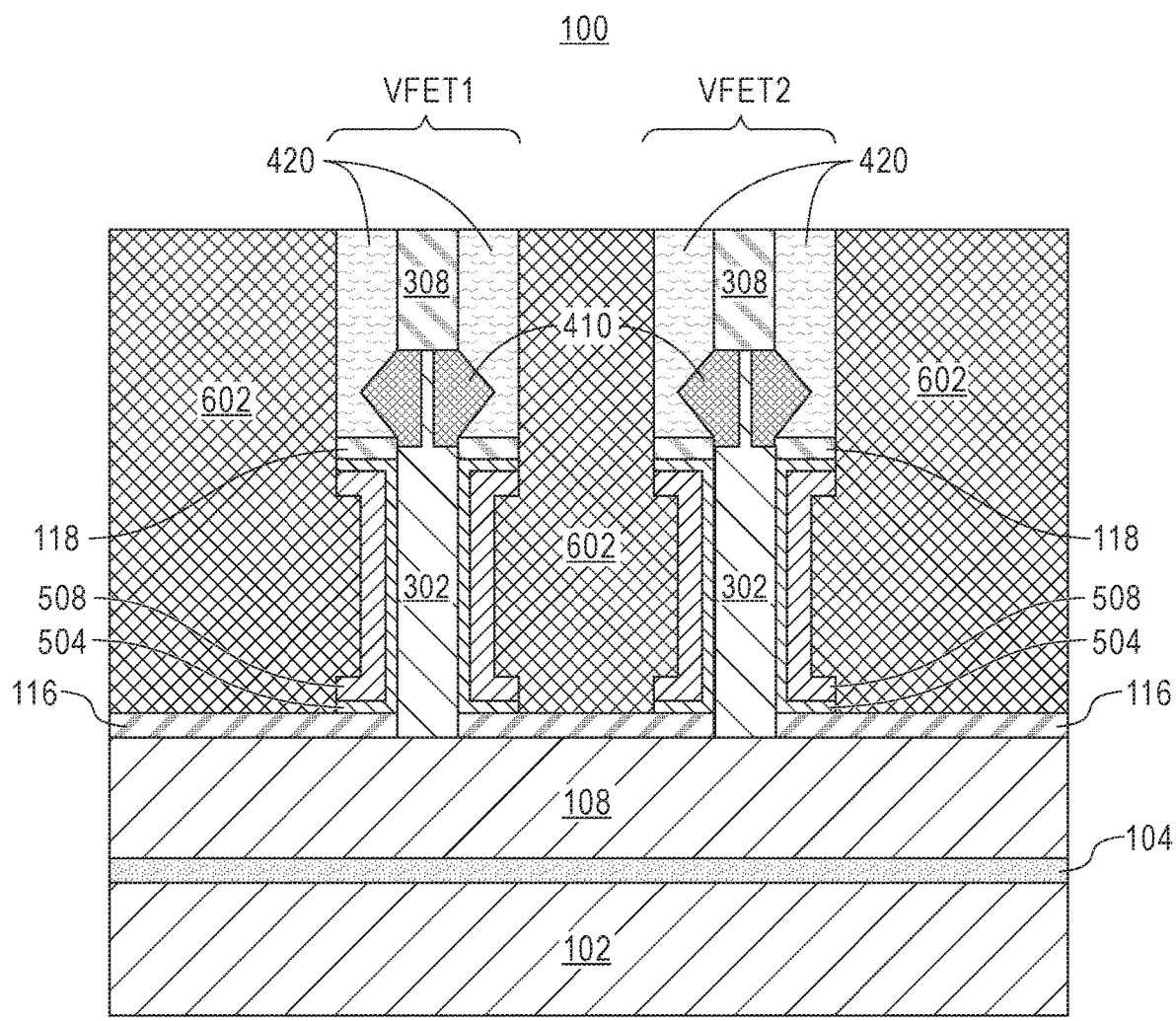
FIG. 6 is a cross-sectional view of the semiconductor device after filling with a metal gate material and conducting a planarization process, according to an embodiment of the present disclosure.

Referring now to FIG. 6, a cross-sectional view of the semiconductor device 100 after filling with a metal gate material 602 and conducting a planarization process on the metal gate material 602 is shown, according to an embodiment of the present disclosure. The metal gate material 602 is a conductive gate metal that is deposited over the gate dielectric material(s) 504 and work function metals 508 to form a gate stack for each of the VFET1 and VFET2. In this embodiment, the metal gate material 602 is deposited between the VFET1 and VFET2 such that a portion of the metal gate material 602 is shared by the two field effect transistors, as mentioned above this may help improve device scalability.

Non-limiting examples of suitable conductive metals include aluminum (Al), platinum (Pt), gold (Au), tungsten (W), titanium (Ti), or any combination thereof. The conductive metal forming the metal gate material 602 may be deposited by a suitable deposition process such as, for example, CVD, PECVD, PVD, plating, thermal or e-beam evaporation, and sputtering. A planarization process, for example, CMP, is performed to polish the surface of the metal gate material 602.

Figure 7:
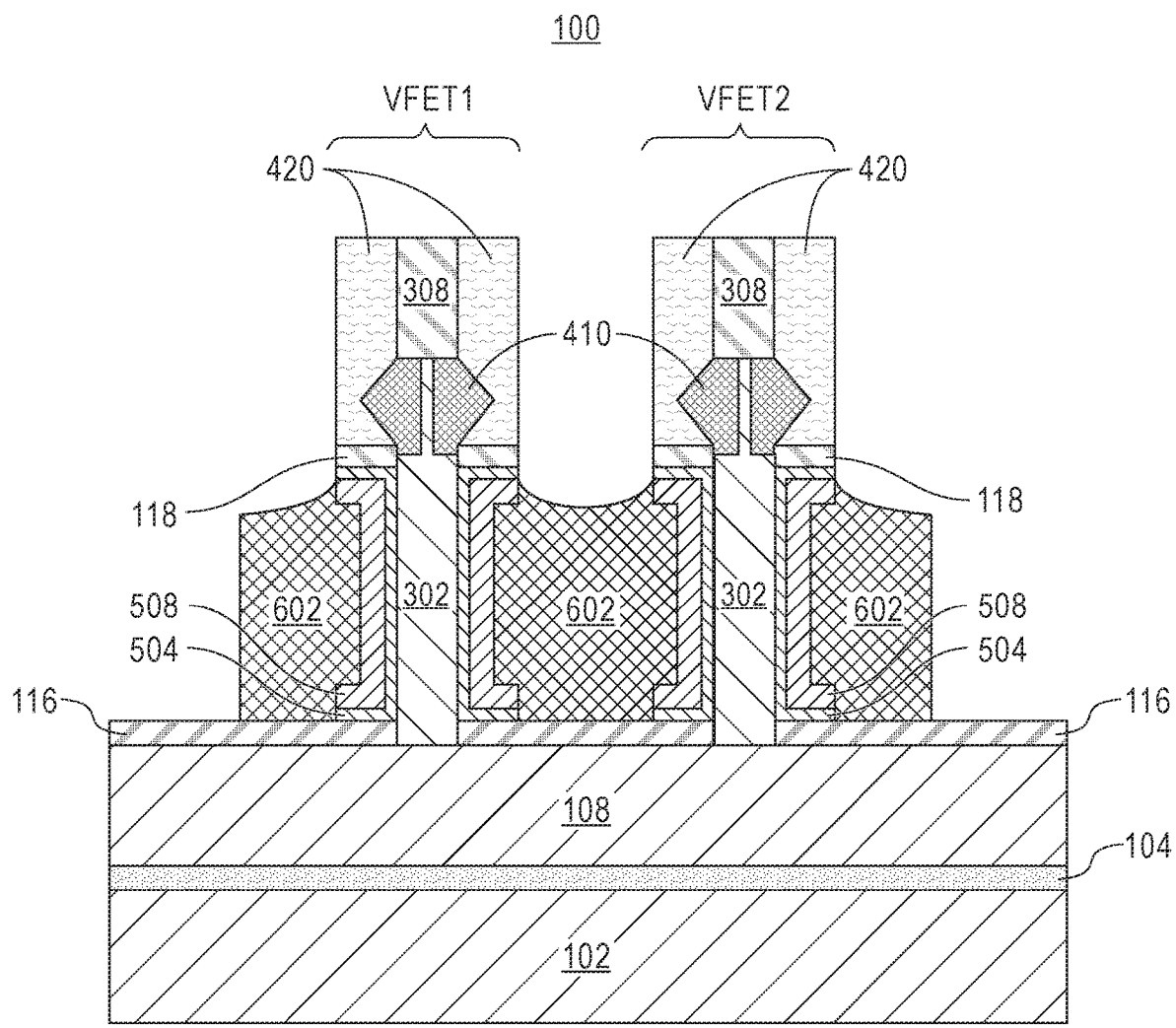
FIG. 7 is a cross-sectional view of the semiconductor device after partially recessing the metal gate material, according to an embodiment of the present disclosure.

Referring now to FIG. 7, a cross-sectional view of the semiconductor device 100 after partially recessing the metal gate material 602 is shown, according to an embodiment of the present disclosure. The metal gate material 602 is partially recessed by an etch process such as, for example, a reactive ion etch process.

Figure 8:
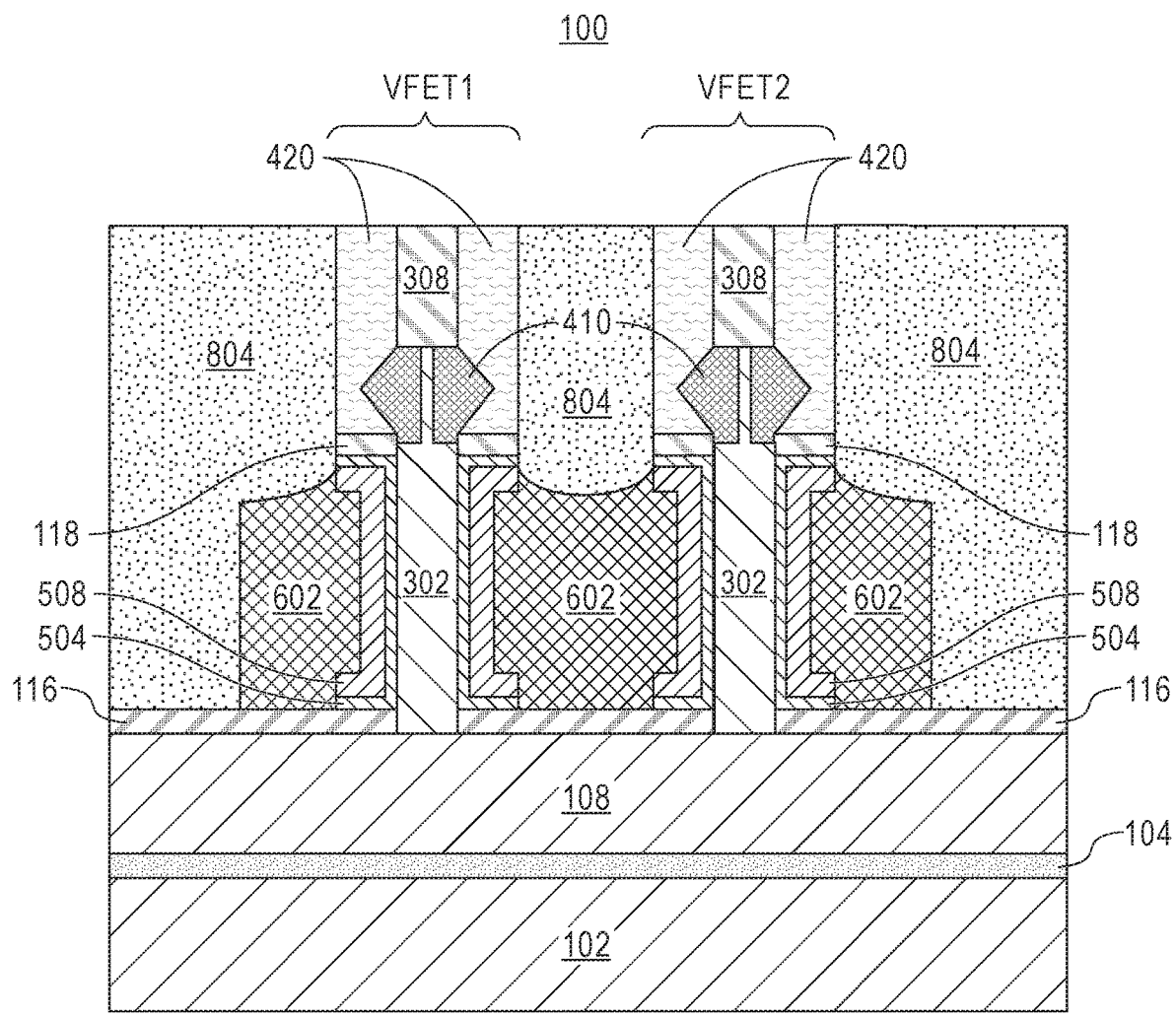
FIG. 8 is a cross-sectional view of the semiconductor device after depositing an interlevel dielectric layer on the metal gate material and conducting a planarization process, according to an embodiment of the present disclosure.

Referring now to FIG. 8, a cross-sectional view of the semiconductor device 100 after depositing an interlevel dielectric (ILD) layer 804 on the metal gate material 602 and conducting a planarization process is shown, according to an embodiment of the present disclosure. The ILD layer 804 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD layer 804 is deposited by a deposition process, including, but not limited to CVD, PVD, PECVD, ALD, evaporation, chemical solution deposition, or like processes.

Figure 9:
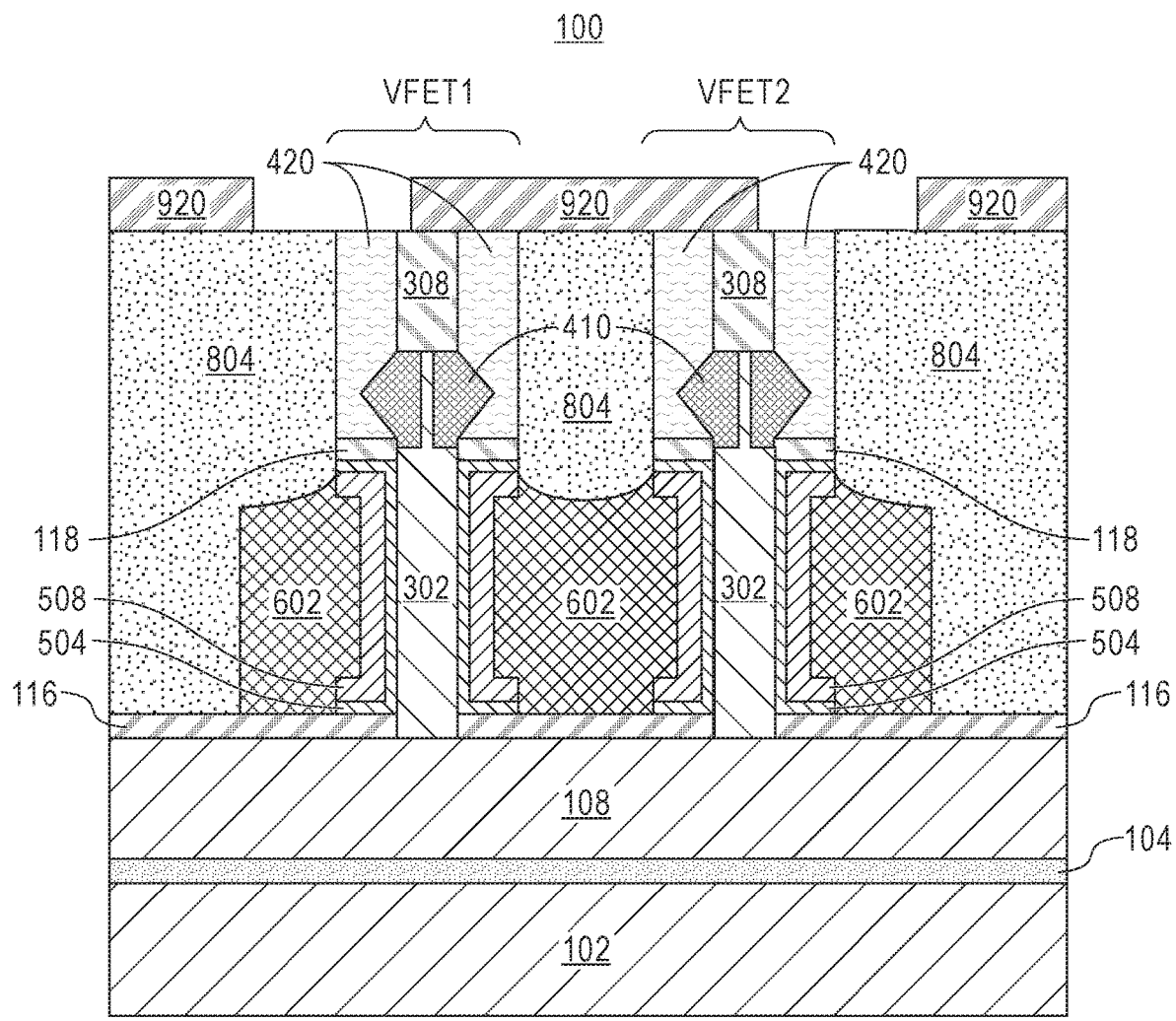
FIG. 9 is a cross-sectional view of the semiconductor device after forming a mask on the interlevel dielectric layer, according to an embodiment of the present disclosure.

Referring now to FIG. 9, a cross-sectional view of the semiconductor device 100 after forming a mask 920 is shown, according to an embodiment of the present disclosure. The mask 920 is deposited onto top surfaces of the semiconductor device 100. As shown in the figure, the mask 920 covers a region between the VFET 1 and VFET 2 including a central portion of the ILD layer 804 above the metal gate material 602. The mask 920 may also cover outer regions of the first ILD layer 804. A portion of the spacer 420 of each vertical transistor and a portion of the first ILD layer 804 remains uncovered. The mask 920 may be made of material that is resistant to etch processes, such that portions of the semiconductor device 100 that are covered by the mask 920 can be protected. The mask 920 is deposited to protect the covered surfaces when the semiconductor device 100 is further processed to form the ReRAM structures shown in FIG. 14.

Figure 10:
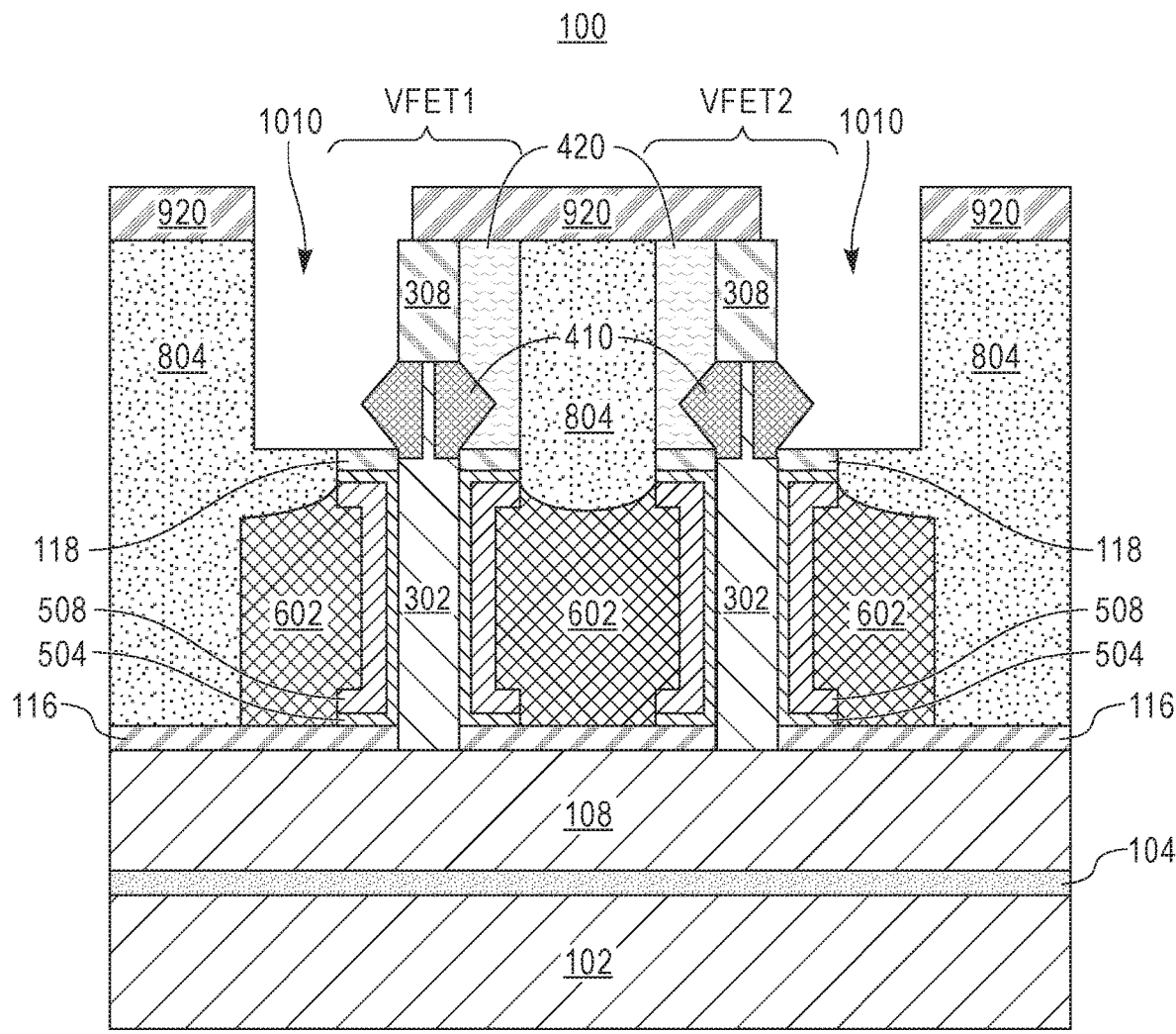
FIG. 10 is a cross-sectional view of the semiconductor device after recessing portions of the interlevel dielectric layer and spacer is shown, according to an embodiment of the present disclosure.

Referring now to FIG. 10, a cross-sectional view of the semiconductor device 100 after recessing portions of the ILD layer 804 and spacer 420 is shown, according to an embodiment of the present disclosure. Recessing the portions of the ILD layer 804 and spacer 420 not covered by the mask 920 creates openings 1010 in the semiconductor device 100. The openings 1010 expose portions of the epitaxial region 410 in each of the VFET1 and VFET2, as shown in the figure. The openings 1010 may also expose the second spacer 118 and sidewalls of the dielectric cap 308 in each of the VFET1 and VFET2.

The portions of the ILD layer 804 adjacent to the VFET1 and VFET2 not covered by the mask 920 can be removed by performing an etch process that is selective to (will not substantially remove) the spacer 420 and the dielectric cap 308. The etch process may be, for example, a reactive ion etch. After recessing the first ILD layer 804, portions of the spacer 420 not protected by the mask 920 (i.e., areas of the spacer 420 on the opposite side of the shared portion of the metal gate material 602) may be removed from the VFET1 and VFET2, respectively, as shown in the figure. According to an embodiment, any suitable etch process may be used to remove the portions of the spacer 420 not covered by the mask 920. The openings 1010 may be subsequently backfilled with other materials to integrate ReRAM structures with each of the VFET1 and VFET2, as will be described in detail below.

Figure 11:
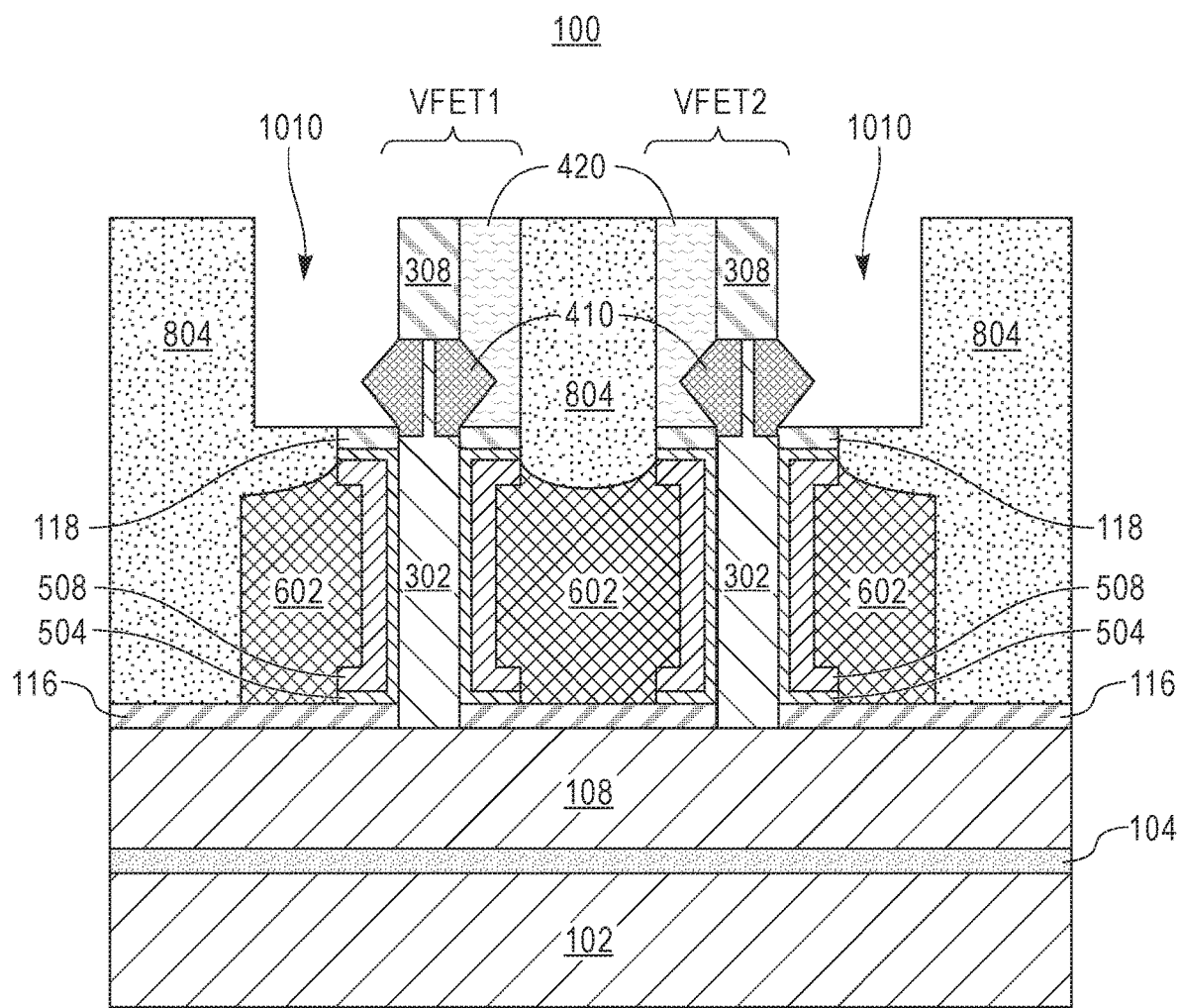
FIG. 11 is a cross-sectional view of the semiconductor device after removing the mask, according to an embodiment of the present disclosure.

After removing the exposed portions of the spacer 420, the mask 920 may be removed by performing any suitable etching technique known in the art, as shown in FIG. 11.

Figure 12:
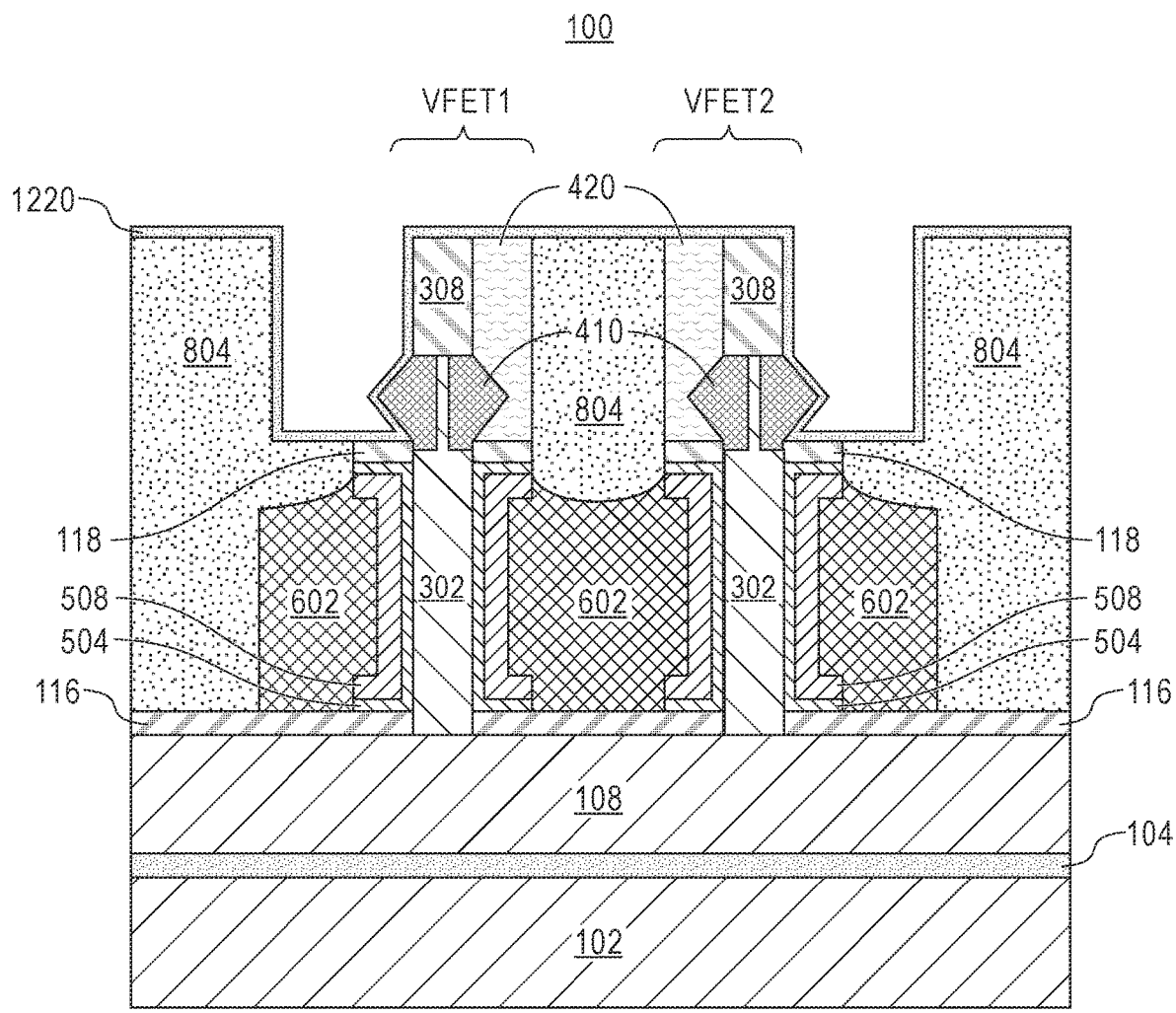
FIG. 12 is a cross-sectional view of the semiconductor device after depositing an oxide layer, according to an embodiment of the present disclosure.

Referring now to FIG. 12, a cross-sectional view of the semiconductor device 100 after depositing an oxide layer 1220 is shown, according to an embodiment of the present disclosure. The oxide layer 1220 is conformally deposited in the openings 1010 (FIG. 11), along exposed sidewalls of the ILD layer 804 and exposed surfaces of the epitaxial region 410, second spacer 118 and dielectric cap 308 in each of the VFET1 and VFET2. The oxide layer 1220 may be conformally deposited using know deposition techniques, such as, for example, ALD. The oxide layer 1220 may be made of a metal oxide material or high-k materials. Non-limiting examples of suitable materials for the oxide layer 1220 may include titanium oxide, tantalum oxide, and hafnium oxide. The oxide layer 1220 serves as a dielectric layer for the ReRAM structures of FIG. 15, separating the epitaxial region 410 from a subsequently formed top electrode.

Figure 13:
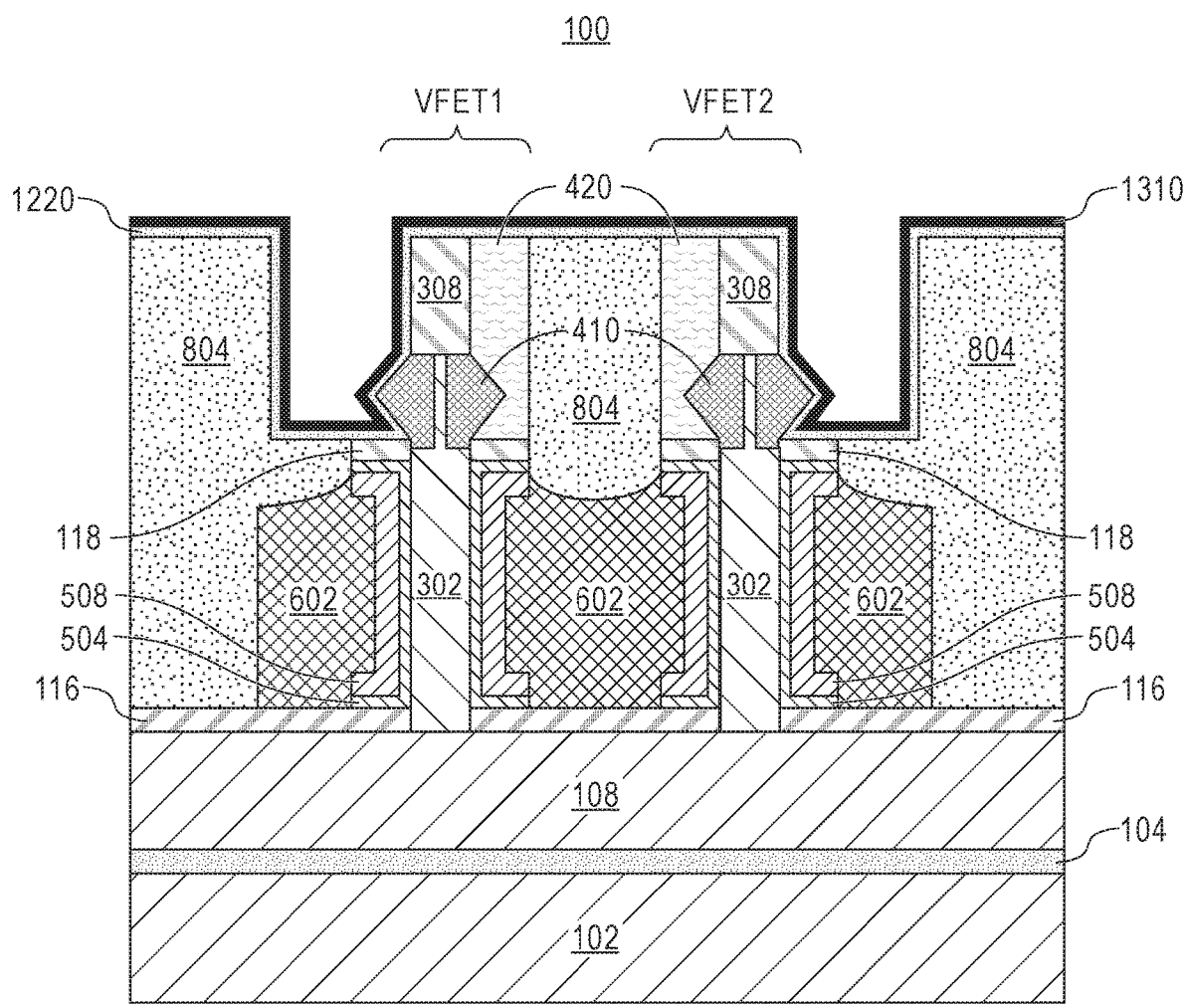
FIG. 13 is a cross-sectional view of the semiconductor device after depositing an electrode, according to an embodiment of the present disclosure.

Referring now to FIG. 13, a cross-sectional view of the semiconductor device 100 after depositing an electrode layer 1310 is shown, according to an embodiment of the present disclosure. The electrode layer 1310 may also be known as the top electrode of the ReRAM structure. The electrode layer 1310 is conformally deposited on top of the oxide layer 1220. The electrode layer 1310 may be deposited using known deposition techniques, such as, for example, ALD. The electrode layer 1310 may be made of materials such as titanium nitride and aluminum doped titanium nitride. The electrode layer 1310 serves as the top electrode for the subsequently formed ReRAM structures, whereas the epitaxial region 410 serves two functions. The epitaxial region 410, in both the VFET1 and VFET2, is the top source/drain region of each VFET, with the doped source 108 acting as the bottom source/drain of the VFET1 and VFET2, respectively. The epitaxial region 410 is also the bottom electrode in the ReRAM structure.

Figure 14:
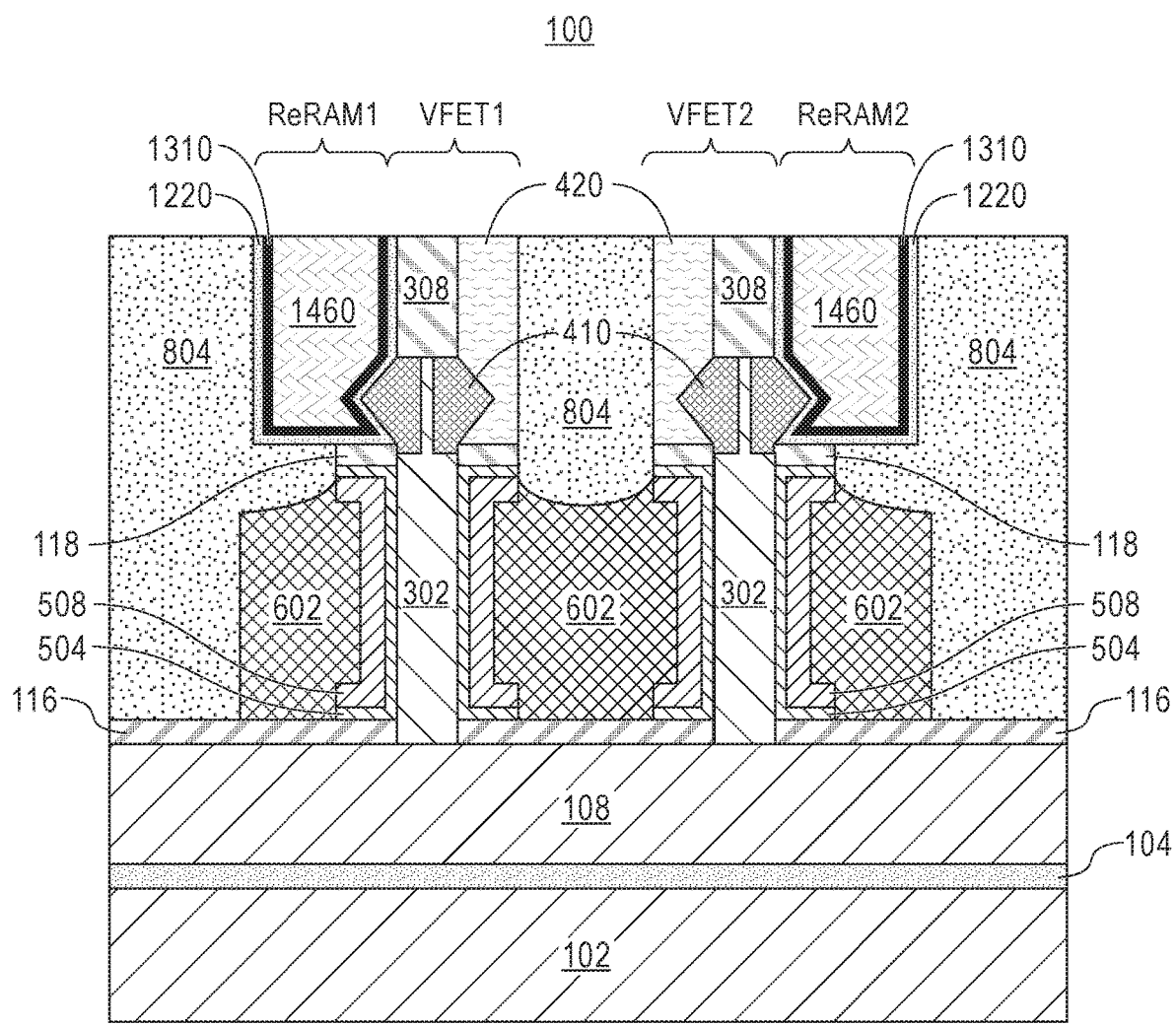
FIG. 14 is a cross-sectional view of the semiconductor device after depositing a metal fill, according to an embodiment of the present disclosure.

Referring now to FIG. 14, a cross-sectional view of the semiconductor device 100 after depositing a metal fill 1460 is shown, according to an embodiment of the present disclosure. After conformally depositing the electrode layer 1310 directly above the oxide layer 1220, the openings 1010 (FIG. 11) are filled with the metal fill 1460 after which, the semiconductor device 100 undergoes a CMP process. The metal fill 1460 may be made of suitable low resistivity metal, such as, for example, tungsten or copper. The metal fill 1460 serves as a conductor of electricity between the electrode layer 1310 and contacts formed on the top surface of the metal fill 1460. The oxide layer 1220, the electrode layer 1310 above the oxide layer 1220, and the metal fill 1460 above the electrode layer 1310 form a ReRAM stack for the two ReRAM structures ReRAM1 and ReRAM2 co-integrated with the VFET1 and VFET2, respectively.

Figure 15:
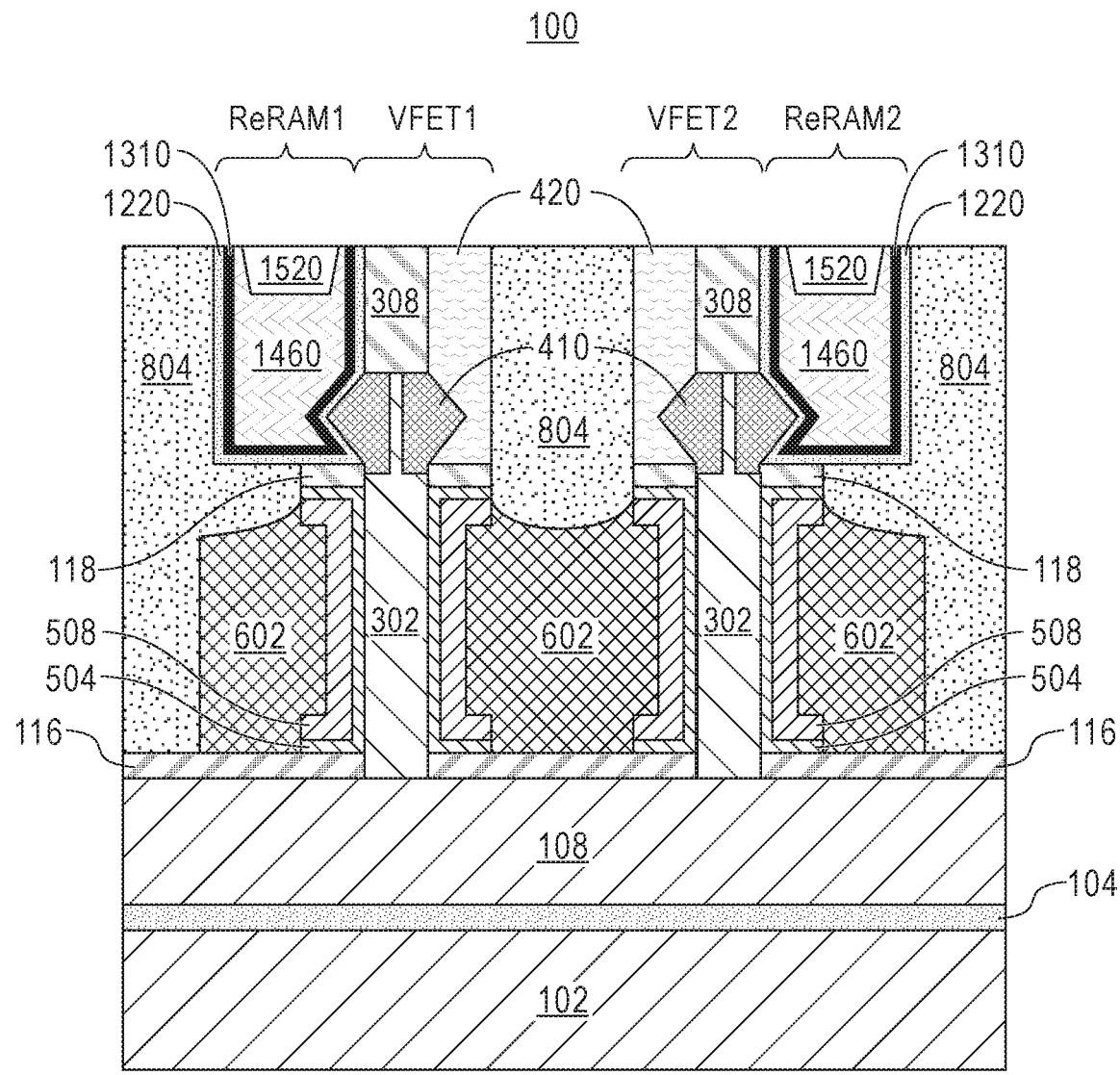
FIG. 15 is a cross-sectional view of the semiconductor device after forming ReRAM contacts, according to an embodiment of the present disclosure.

Referring now to FIG. 15, a cross-sectional view of the semiconductor device 100 after forming ReRAM contacts 1520 is shown, according to an embodiment of the present disclosure. It should be noted that, although not depicted in the figure, source/drain contacts and gate contacts can also be formed in the semiconductor device 100. The process of forming ReRAM, source/drain and gate contacts is standard and well-known in the art. The process typically include forming trenches (not shown) to the target regions (i.e., metal fill 1460, doped source 108, and metal gate material 602) and filling the trenches with a conductive material or a combination of conductive materials.

Source/drain contacts (not shown) may extend through the first ILD layer 804 and the first spacer 116 to the doped source 108 and are formed within a trench (not shown). The conductive material filling the source/drain contacts includes a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD layer 804.

The gate contacts (not shown) extend from a surface of the ILD layer 804 through the metal gate material 602. The conductive material forming the gate contacts may be a conductive metal, for example, aluminum (Al), platinum (Pt), gold (Au), tungsten (W), titanium (Ti), or any combination thereof deposited by a suitable deposition process, for example, CVD, PECVD, PVD, plating, thermal or e-beam evaporation, or sputtering. A planarization process, for example, CMP, is performed to remove any conductive material from the surface of the ILD layer 804.

ReRAM contacts 1520 may be subsequently formed above and in direct contact with the metal fill 1460. The ReRAM contacts 1520 may be made of a conductive metal including, for example, aluminum (Al), platinum (Pt), gold (Au), tungsten (W), titanium (Ti), or any combination thereof.

Therefore, embodiments of the present disclosure provide a semiconductor device, and a method of making the same, that includes two ReRAM elements (ReRAM1 and ReRAM2) each integrated vertically on an outer top portion of a first VFET device (VFET1) and an outer top portion of a second VFET device (VFET2). The first VFET device and the second VFET device share a metal gate which may allow substantial reduction (scaling) of the pitch between devices. In the proposed embodiments, each memory cell in the final semiconductor device includes two resistive memory elements and two selectors (2T2R) in which the oxide ReRAMs are formed in the facetted epitaxy drain regions to enhance the electric field at a tip of the (triangular-shaped) facetted epitaxy regions, this may also allow for a reduced device footprint. The bottom electrode of each resistive memory element (ReRAM1 and ReRAM2) is the triangular-shaped protruding portion of the top source/drain region of each vertical field effect transistor. More specifically, the epitaxial region 410 includes a diamond-shaped faceting effect consequence of a differential growth along different crystallographic planes that causes the two opposing protruding regions of the epitaxial region 410 be bounded by <111> planes. The proposed semiconductor device also includes a channel region made of a single-crystalline semiconductor material which further enhances device performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
two vertical field effect transistors, each vertical field effect transistor comprising an epitaxial region located above a channel region and below a dielectric cap, the epitaxial region comprising two opposing protruding regions of triangular shape that extend horizontally beyond the channel region;
a metal gate material disposed on and around the channel region, wherein a portion of the metal gate material is located between the two vertical field effect transistors;
an interlevel dielectric layer above the metal gate material; and
two resistive random access memory structures, each resistive random access memory is adjacent to a side of a vertical field effect transistor of the two vertical field effect transistors that is opposing the portion of the metal gate material located between the two vertical field effect transistors, wherein each of the resistive random access memory structures comprises an oxide layer located directly above the epitaxial region, a top electrode layer directly above the oxide layer and a metal fill above the top electrode layer, wherein the epitaxial region acts as a bottom electrode for the resistive random access memory structure.

2. The semiconductor device of claim 1, wherein the two vertical field effect transistor further comprises:
a doped source on a substrate, the channel region extending from the doped source.

3. The semiconductor device of claim 2, further comprises:
a counter-doped layer between the substrate and the doped source, wherein the doped source comprises a first dopant, and the counter-doped layer comprises a second dopant that is different than the first dopant.

4. The semiconductor device of claim 3, further comprising:
a source/drain contact contacting the doped source.

5. The semiconductor device of claim 1, further comprising:
a gate contact contacting the metal gate material.

6. The semiconductor device of claim 1, further comprising:
a resistive random access memory contact contacting a top portion of the metal fill in each vertical field effect transistor.

* * * * *